(12) United States Patent
Hara

(10) Patent No.: US 7,387,945 B2
(45) Date of Patent: Jun. 17, 2008

(54) SEMICONDUCTOR CHIP, SEMICONDUCTOR DEVICE AND ELECTRONIC EQUIPMENT INCLUDING WARPAGE CONTROL FILM, AND MANUFACTURING METHOD OF SAME

(75) Inventor: Kazumi Hara, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/116,046

(22) Filed: Apr. 27, 2005

(65) Prior Publication Data

US 2005/0253235 A1 Nov. 17, 2005

(30) Foreign Application Priority Data

May 11, 2004 (JP) ............... 2004-141215

(51) Int. Cl.
*H01L 21/30* (2006.01)
(52) U.S. Cl. ............ 438/457; 257/701; 257/702; 438/125
(58) Field of Classification Search ........ 438/457, 438/125, 701, 702; 257/701, 702
See application file for complete search history.

(56) References Cited

U.S. PATENT DOCUMENTS

| 5,827,771 | A | * | 10/1998 | Ginn et al. ............ 438/457 |
| 5,876,789 | A | | 3/1999 | Nakada |
| 5,986,217 | A | * | 11/1999 | Strum ............... 174/260 |
| 6,214,733 | B1 | * | 4/2001 | Sickmiller ............ 438/691 |
| 6,555,460 | B2 | * | 4/2003 | Farnworth ............ 438/614 |
| 6,611,065 | B2 | | 8/2003 | Takeichi et al. |
| 6,756,285 | B1 | * | 6/2004 | Moriceau et al. ........ 438/455 |

| 2004/0266139 | A1 | | 12/2004 | Shibata |
| 2005/0031997 | A1 | * | 2/2005 | Chang et al. ............ 430/320 |

FOREIGN PATENT DOCUMENTS

| JP | 63-004653 | | 1/1988 |
| JP | 03-181116 | | 8/1991 |
| JP | 404033336 A | * | 2/1992 |
| JP | 05-129304 | | 5/1993 |
| JP | 08-111360 | | 4/1996 |
| JP | 08-153823 | | 6/1996 |
| JP | 09-017702 | | 1/1997 |
| JP | 10-270607 | | 10/1998 |
| JP | 411170376 A | * | 6/1999 |
| JP | 11-330308 | | 11/1999 |
| JP | 2000-243754 | | 9/2000 |
| JP | 2002-151346 | | 5/2002 |
| JP | 2002-231864 | | 8/2002 |
| JP | 2002-270479 | | 9/2002 |
| JP | 2002-319658 | | 10/2002 |
| JP | 2003-174114 | | 6/2003 |
| JP | 2003-273357 | | 9/2003 |
| JP | 2004-079928 | | 3/2004 |

OTHER PUBLICATIONS

Shigeki Inoue, "Chrono-Bit Development and Packaging Technology", Electronics Packaging Technology, vol. 16, No. 12, pp. 40-45 (2000).

* cited by examiner

*Primary Examiner*—Thao X. Le
*Assistant Examiner*—Ajay K Arora
(74) *Attorney, Agent, or Firm*—Harness, Dickey & Pierce, P.L.C.

(57) ABSTRACT

A semiconductor chip is provided that is highly packageable and particularly well suited for mounting on a circuit board having a curved surface. The semiconductor chip comprises a warpage control film that controls the warpage of a substrate.

20 Claims, 5 Drawing Sheets

SEMICONDUCTOR CHIP, SEMICONDUCTOR DEVICE AND ELECTRONIC EQUIPMENT INCLUDING WARPAGE CONTROL FILM, AND MANUFACTURING METHOD OF SAME

RELATED APPLICATIONS

This application claims priority to Japanese Patent Application No. 2004-141215 filed May 11, 2004 which is hereby expressly incorporated by reference herein in its entirety.

BACKGROUND

1. Technical Field

The present invention relates to a semiconductor chip and a circuit board, a manufacturing method of the same, and electronic equipment.

2. Related Art

For wearable equipment such as wristwatches, it is being demanded that they should make more efficient use of the holding space on their circuit boards due to requirements for increased compactness of such equipment (see for example Inoue, "Chrono-Bit no Kaihatsu to Jisso Gijutsu" (Chrono-Bit Development and Packaging Technology)", *Erekutor-onikkusu Jisso Gijutsu* (*Electronics Packaging Technology*), Gicho Publishing & Advertising Co., Ltd., 2000, Vol. 16 No. 12 (December 2000 issue), p. 40-45). To meet such need, the use of circuit boards with curved surfaces is being considered. It would for instance be possible to realize flat-type equipment by bending the case and the circuit board to the same curvature.

When semiconductor chips are packaged onto circuit boards with curved surfaces, flexible boards with a base material such as polyimide have been used. Multilayer interconnection is problematic with flexible boards however, so there is a limit to their capacity for high density and high functionality. Furthermore, inducing warpage in the circuit boards after the semiconductor chip has been packaged produces stress in the bonding portions that could lead to poor couplings. Sheathing with resin for reinforcement purposes causes a marked fall in bendability.

The present invention has been made in consideration of the aforementioned problems, and intends to provide a highly packageable semiconductor chip that is capable of, among other things, being mounted on a circuit board with a curved surface.

Another purpose of the present invention is to provide a high reliability semiconductor device and a method for manufacturing the same.

A further purpose of the present invention is to provide electronic equipment that is flatter, more compact and that allows greater degrees of freedom in design.

SUMMARY

In order to achieve the aforementioned purposes, the semiconductor chip of the present invention comprises a warpage control film that controls the warpage of its substrate.

With the warpage control film, any desired warpage can be produced in this semiconductor chip substrate. As a result, this semiconductor chip is highly packageable and is capable of, among other things, being mounted as desired on circuit boards having surfaces of various forms including curved.

In the aforementioned semiconductor chip, the warpage control film may undergo patterning. Patterning of the warpage control film will enhance the warpage controllability and the diversity of the control, thereby enabling warpage to be induced in a particular intended direction, or to be induced in certain parts only.

Further, the substrate of the aforementioned semiconductor chip may undergo a thinning process. Such thinning processing will render the substrate conducive to warping and will also facilitate control of the warping.

Such thinning processing may be used to provide the substrate with local thickness differences. This will facilitate control of the substrate warpage to a desired state such as warpage with varying curvature or warpage induced in certain parts only.

Next, a semiconductor device of the present invention comprises the aforementioned semiconductor chip and the circuit board on which the semiconductor chip is mounted.

According to this semiconductor device, the semiconductor chip is coupled to the curved-surface circuit board with high reliability due to the fact that warpage has been induced in the semiconductor chip. That is, the circuit board and semiconductor chip are coupled together via their like curved surfaces, which enables the stress occurring at their coupling portions to be kept low, thus raising the coupling reliability.

The aforementioned semiconductor device may have a warpage control film to control the circuit board warpage. The warpage control film will enable the desired warpage to be induced in the circuit board.

In this case, the warpage control film may undergo patterning. Patterning of the warpage control film will enhance the warpage controllability and the diversity of the control, thereby enabling warpage to be induced in a particular intended direction, or to be induced in certain parts only.

Further, the circuit board of the aforementioned semiconductor device may undergo a thinning process. The thinning processing of the circuit board will render the circuit board conducive to warping and will also facilitate control of the warping.

Such thinning processing may be used to provide the circuit board with local thickness differences. This will facilitate control of the circuit board's warping to a desired state such as warpage with varying curvature or warpage induced in certain parts only.

Further, in the aforementioned semiconductor device, the circuit board may be composed of a silicon board, so that it is of the same material as the semiconductor chip mounted on it, thus raising the reliability with regard to thermal stress.

Next, electronic equipment of the present invention comprises the aforementioned semiconductor device. Examples of electronic equipment of the present invention include portable equipment such as a cell-phone handset or electronic notebook; a timepiece, notebook personal computer or wearable item; or else a data processing device such as a word processor. Being equipped with the semiconductor device of the present invention allows such electronic equipment to be flatter and more compact and allows greater degrees of freedom in design.

The manufacturing method of the semiconductor device of the present invention is a method for manufacturing a semiconductor device that comprises a semiconductor chip and a circuit board on which the semiconductor chip is mounted, wherein a warpage control film is formed that controls the warpage of at least one of the semiconductor chip substrate and the circuit board.

According to the manufacturing method of the semiconductor device, it is possible to induce the desired warpage in the semiconductor chip and the circuit board by the warpage control film. With warpage induced in the semiconductor chip, the semiconductor chip can be coupled with high reliability to the curved-surface circuit board. That is, the circuit board and semiconductor chip are coupled together via their like curved surfaces, which enables the stress occurring at their coupling portions to be kept low, thus raising the coupling reliability.

The aforementioned manufacturing method may include patterning the warpage control film. Patterning of the warpage control film will enhance the warpage controllability and the diversity of the control, thereby enabling warpage to be induced in a particular intended direction, or to be induced in certain parts only.

Further, in the aforementioned semiconductor device at least one of the semiconductor chip substrate and the circuit board may undergo a thinning process, which will render the semiconductor chip substrate and/or circuit board conducive to warping and will also facilitate control of the warping.

BRIEF DESCRIPTION OF THE DRAWINGS

FIGS. 1A and 1B are drawings schematically showing one example of the semiconductor chip of the present invention wherein FIG. 1A is a cross-sectional view and FIG. 1B is a view taken along A-A in FIG. 1A.

FIGS. 6A-6C are drawings schematically showing another example of the semiconductor chip of the present invention wherein FIG. 6A is a plan view (top view), FIG. 6B is a bottom view, and FIG. 6C is a cross-sectional view.

FIGS. 7A and 7B are drawings schematically showing a further example of the semiconductor chip of the present invention wherein FIG. 7A is a plan view (top view) and FIG. 7B is a cross-sectional view.

FIGS. 8A and 8B are drawings schematically showing yet a further example of the semiconductor chip of the present invention wherein FIG. 8A is a plan view (top view) and FIG. 8B is a cross-sectional view.

DETAILED DESCRIPTION

Next, a description of the semiconductor chip of the present invention will be given.

Figure 1A:
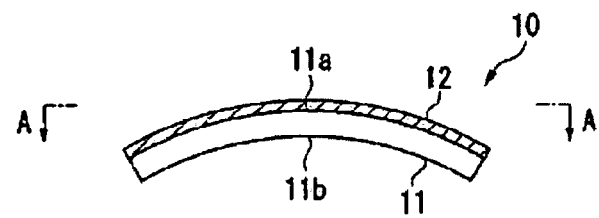
Figure 1B:
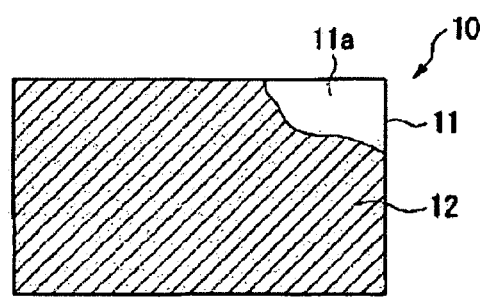

FIG. 1A is a cross-sectional view schematically showing one example of the semiconductor chip of the present invention. FIG. 1B is a view along A-A in FIG. 1A.

In a semiconductor chip 10 (IC chip) in FIG. 1, for example, integrated circuits are formed. A substrate 11 of the semiconductor chip 10 is composed of, for example, silicon. The semiconductor chip 10 is structured so that it has an insulating film 12 as an electrical insulator, and this insulating film 12 functions as a warpage control film for inducing warpage in the substrate 11 of the semiconductor chip 10. In the present example, the insulating film 12 is formed over the entire top surface 11a of the substrate 11. The insulating film 12 (warpage control film) will preferably be formed on the outermost surface of the substrate 11, in the interest of enhancing warpage controllability, but the surface on which it is formed need not necessarily be the outermost. For the sake of simplicity, the remainder of this description will use the terms "top surface" and "bottom surface" consistent with the figure, but these terms should not be construed to limit in any way the arrangement of the objects involved. In the semiconductor chip 10, the top surface 11a of the substrate 11 is the active side while its bottom surface 11b is the reverse side—but merely as an example.

The insulating film 12 may be formed of $SiO_2$, SiN, polyimide or the like, but it might alternatively be composed of some other material. The insulating film 12 may be formed using a deposition method such as the CVD method, or a coating method such as spin coating. Where the substrate 11 is composed mainly of silicon material, the outer surface of the substrate 11 may be thermally oxidized in a thermal oxidation furnace or the like before the insulating film 12 ($SiO_2$) is formed.

Warpage is induced throughout the entire substrate 11. This warpage is induced according to the difference between the linear expansion coefficients of the substrate 11 and insulating film 12 during the process of cooling of the substrate 11 from a high temperature state to a normal (i.e., ambient) temperature state in the course of the forming of the insulating film 12. For instance, if the thermal contraction of the substrate 11 side is higher than that of the insulating film 12 during such cooling process, that is, if the linear expansion coefficient of the substrate 11 is higher than that of the insulating film 12, then the substrate 11 will curve in such a manner that the surface on which the insulating film 12 is formed (its top surface 11a) will be convex and its opposite surface (bottom surface 11b) will be concave, as shown in FIG. 1. The direction and form of the warpage of the substrate 11 induced via the insulating film 12 are determined by the rigidity and other characteristics of the materials of the substrate 11 and insulating film 12, and also by the processing conditions (film thickness and forming temperature) and so on during the forming of the film, in addition to the linear expansion coefficients.

The linear expansion coefficient of silicon is 2 to 4 ppm/° C. (around 2.8 ppm/° C.), whereas the linear expansion coefficients of SiO2 and SiN are lower: 0.5 to 1 ppm/° C. for SiO2; and 2.8 to 3.2 ppm/° C. for SiN. When the substrate 11 is composed mainly of silicon, warpage such as shown in FIG. 1 can be induced in the substrate 11 by forming a film of SiO2 or SiN on one of the surfaces (e.g., top surface 11a) of the substrate 11.

In contrast, polyimide has a linear expansion coefficient of 40 to 70 ppm/° C. (around 55 ppm/° C.), which is high compared to that of silicon. Therefore, by forming a film of polyimide on one surface (e.g., the top surface 11a) of the substrate 11, it will be possible to induce in the substrate 11 a warpage of the opposite direction to that shown in FIG. 1, that is, to form a warpage of substrate 11 in which the surface (top surface 11a) with the insulating film 12 is concave and the opposite surface (bottom surface 11b) is convex.

Thus, having the warpage in the substrate 11 induced by the insulating film 12 renders the semiconductor chip 10 highly packageable, so that (among other things) it can be mounted as desired on circuit boards with curved and various other surfaces.

Here, during the process of manufacturing the semiconductor chip 10, the substrate 11 may undergo a thinning process. Such thinning will, for example, involve using a grinder or similar mechanical grinding device to reduce the thickness of the substrate 11 to a thickness of around 100 microns or less. Such thinning will further include, in addition to such mechanical grinding, a stress relief process that removes the roughened layer (also called the "stress layer" or "altered layer") produced on the substrate 11 by such grinding. Such stress relief may be implemented using a commonly known technique such as spin etching, polishing, CMP, or dry etching. During the thinning process, the substrate 11 may be supported by a piece of glass, metal sheet, PET or the like. Adhesive, two-sided tape or the like may be used as the material for securing the substrate 11 to such a support. These items will preferably be able to withstand the stress relief and other processing.

The thinning processing of the substrate 11 will render the substrate 11 conducive to warping and will also facilitate control of the warping. In addition, performing stress relief processing during the thinning process will improve the bending strength of the substrate 11, by curbing cracks in the substrate 11 and so forth.

Figure 2:
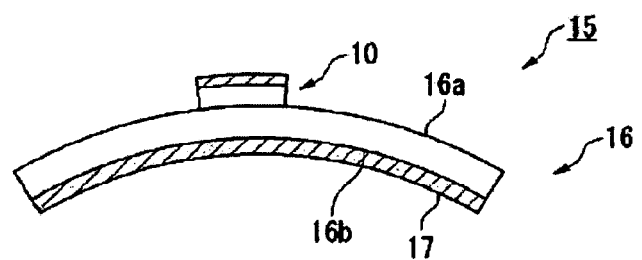
FIG. 2 is a schematic cross-sectional view schematically showing one example of the semiconductor chip of the present invention.

FIG. 2 is a cross-sectional view schematically showing one example of a semiconductor device of the present invention.

A semiconductor device 15 in FIG. 2 is composed of the aforementioned semiconductor chip 10 mounted on a circuit board 16. The circuit board 16 is composed of silicon for example, and is formed so as to have a curved surface 16a (mounting surface). Warpage is induced in the semiconductor chip 10 so as to copy (i.e., compliment or match) the curved surface 16a.

In the present example, the warpage of the circuit board 16 is induced by an insulating film 17, which also functions as a warpage control film formed on the opposite surface to the semiconductor chip 10 mounting surface (i.e. on a reverse surface 16b). The insulating film 17 may be formed of $SiO_2$, SiN, polyimide or the like. In the present example, polyimide is used. The aforementioned warpage is induced according to the difference between the linear expansion coefficients of the circuit board 16 and insulating film 17 during the process of cooling of the circuit board 16 from a high temperature state to a normal (i.e., ambient) temperature state in the course of the forming of the insulating film 17. As mentioned earlier, the direction in which the warpage is induced will differ depending on whether the material forming the insulating film 17 is $SiO_2$/SiN on the one hand, or polyimide on the other.

The insulating film 17 may be formed using a deposition method such as the CVD method, or a coating method such as spin coating. Where the circuit board 16 is composed mainly of silicon material, one surface of the circuit board 16 may be thermally oxidized in a thermal oxidation furnace or the like before the insulating film ($SiO_2$) serving as the warpage control film is formed on it. The direction and form of the warpage of the circuit board 16 induced via the insulating film 17 are determined by the rigidity and other characteristics of the materials of the circuit board 16 and insulating film 17, and also by the processing conditions (film thickness and forming temperature) and so on during forming of the film, in addition to the linear expansion coefficients.

During the process of manufacturing the semiconductor device 15, the circuit board 16 may undergo a thinning process. Such thinning of the circuit board 16 will, for example, involve a mechanical grinding process using a grinder or the like. Such thinning of the circuit board 16 will render the circuit board 16 conducive to warping and will also facilitate control of the warping.

For mounting the semiconductor chip 10 on the circuit board 16, a method such as heating or pressurizing may be used. For example, alloy bonding such as solder bonding or ultrasonic bonding, or resin bonding such as NCF, ACF or ACA, or bonding by a material such as silver paste, and so on may be used. Since warpage is induced in the semiconductor chip 10 so as to match the curved surface 16a of the circuit board 16, little stress will occur in the coupling portions of the circuit board 16 and semiconductor chip 10 during bonding.

Thus, with the semiconductor device 15 of the present example, the fact that the semiconductor chip 10 and circuit board 16 are coupled together via their like curved surfaces means that little stress will occur in the coupling portions of the circuit board 16 and semiconductor chip 10, and hence that poor couplings will be unlikely. In other words, the coupling reliability is enhanced.

Figure 3:
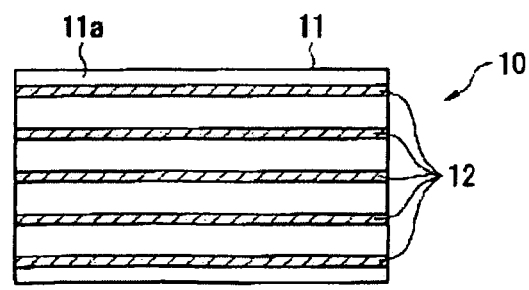
FIG. 3 is a plan view showing a variant of the semiconductor chip of the present invention.
Figure 4:
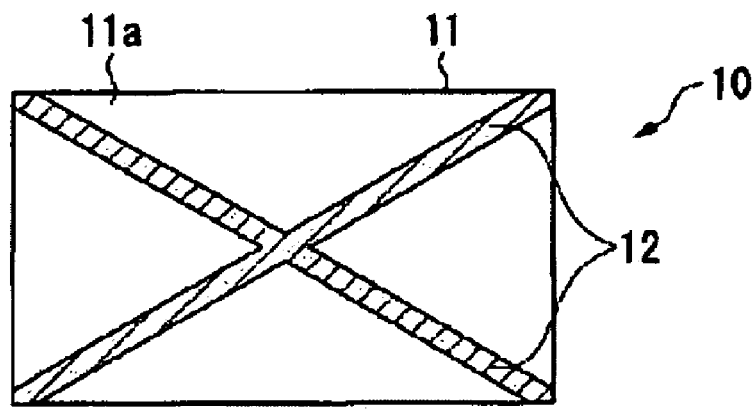
FIG. 4 is a plan view showing another variant of the semiconductor chip of the present invention.
Figure 5:
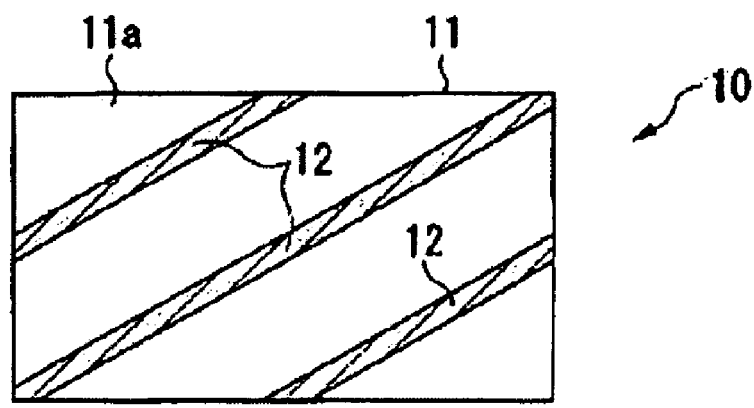
FIG. 5 is a plan view showing a further variant of the semiconductor chip of the present invention.

FIGS. 3 through 5 are plan views showing examples of variants of the semiconductor chip 10 shown in FIGS. 1A and 1B.

In the example shown in FIG. 3, the insulating film 12 is formed in stripes on the top surface 11a of the substrate 11 of the semiconductor chip 10. More specifically, the substrate 11 is composed of a planar rectangular plate shape, and multiple films are formed on the top surface 11a of the substrate 11 in lines extending parallel to its long edges and are evenly spaced apart from one another. In the example of FIG. 3, the area over which the insulating film 12 is formed is smaller than in FIG. 1, so that, other conditions being the same, warpage will occur in the direction of the long edges but will be smaller in the direction of the short edges, as compared to FIG. 1.

In the example shown in FIG. 4, the insulating film 12 is formed on the top surface 11a of the substrate 11 of the semiconductor chip 10 in the shape of two lines of film that cross each other (e.g., an X shape). These two lines of film each extend diagonally relative to the edges of the rectangular substrate 11. In the example of FIG. 4, the forces acting between the substrate 11 and the insulating film 12 will follow the lines of film and hence cross over each other, so that the semiconductor chip 10 will be of a form such that it has compound warpages in various parts.

In the example shown in FIG. 5, the insulating film 12 is formed in stripes on the top surface 11a of the substrate 11 of the semiconductor chip 10, like in FIG. 3. But unlike in FIG. 3, the multiple film lines of insulating film 12 are laid out diagonally relative to the edges of the rectangular substrate 11. In the example of FIG. 5, the forces that are produced by the difference between the linear expansion coefficients of the substrate 11 and insulating film 12 will act in a diagonal direction relative to the edges of the substrate 11. That is, they will act in the direction in which the lines of insulating film 12 extend, so that warpage will be induced in the substrate 11 along the direction in which such lines extend.

The insulating film shown in FIGS. 3 through 5 has been formed via patterning. Patterning of the insulating film 12 could be implemented by covering the required portions with masking and etching away the non-required portions, using for example RIE (reactive ion etching). On the other hand, patterning could be implemented using wet etching that employs resist masking. Patterning of the insulating film 12, which also serves as the warpage control film, enhances the warpage controllability and the diversity of the control, enabling warpage to be induced in a particular intended direction, or to be induced in certain parts only.

Figure 6A:
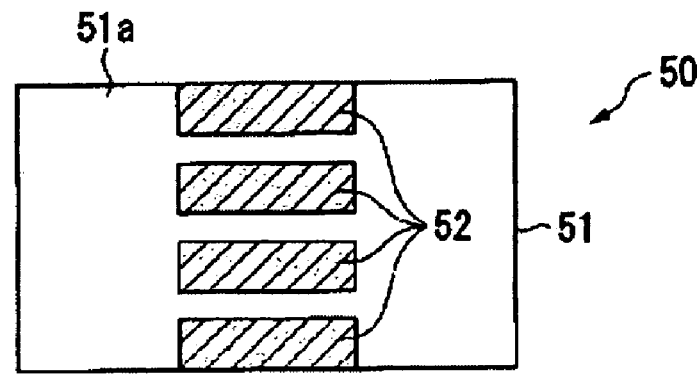
Figure 6B:
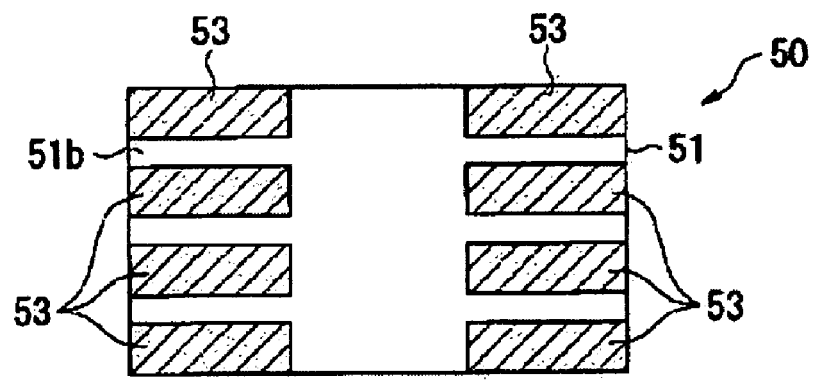
Figure 6C:
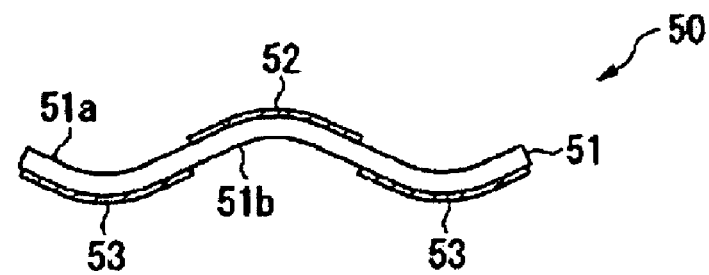

FIGS. 6A-6C schematically show another example of the semiconductor chip of the present invention. FIG. 6A is a plan view (top view) of the chip, FIG. 6B is a bottom view, and FIG. 6C is a cross-sectional view.

In FIG. 6, insulating films 52 and 53, which also serve as warpage control films, are formed respectively on a top surface 51*a* and bottom surface 51*b* of a substrate 51 of a semiconductor chip 50. The insulating film 52 on the top surface 51*a* of the substrate 51 is formed locally in the central portion of the rectangular substrate 51. This insulating film 52 takes the form of multiple lines of film that extend in the direction of the long edges of the substrate 51 and are spaced evenly apart in the direction of the short edges. On the other hand, the insulating film 53 formed on the bottom surface 51*b* of the substrate 51 is formed locally near both short edges of the rectangular substrate 51. Further, it takes the form of multiple lines of film that extend in the direction of the long edges of the substrate 51 and are spaced evenly apart in the direction of the short edges. The top surface 51*a* of the substrate 51 is, for example, the active side while its bottom surface 51*b* is the reverse side. Due to the insulating film 52 on its top surface 51*a* and the insulating film 53 on its bottom surface 51*b*, the semiconductor chip 50 of the present example has a warpage configuration whereby multiple curved surfaces are compounded together, as shown in FIG. 6C.

If the thinning processing described earlier is performed on the semiconductor chip 50, then the stress relief process, composing of spin etching, polishing, CMP, or dry etching, etc., should preferably be completed before forming the insulating films 52 and 53. Additionally, a support may be secured to one side of the substrate 51 (for example its active side), in order to enhance the ability to handle the flattened substrate 51 and prevent cracks in the substrate 51. Such support will preferably be secured before the substrate 51 undergoes the thinning processing. The adhesive agent, adhesive tape or the like for securing the support will preferably be able to withstand the grinding, dry or wet etching and other processing. The support might alternatively be secured after the thinning processing of the substrate 51.

The application of such insulating films is not limited to the semiconductor chip; insulating films that will serve as warpage control films may equally well be formed on the top surface and on the bottom surface of the circuit board shown in FIG. 2. Forming insulating films (warpage control films) on the circuit board top and bottom surfaces will make it possible to induce warpage with a configuration whereby multiple curved surfaces are compounded together.

Figure 7A:
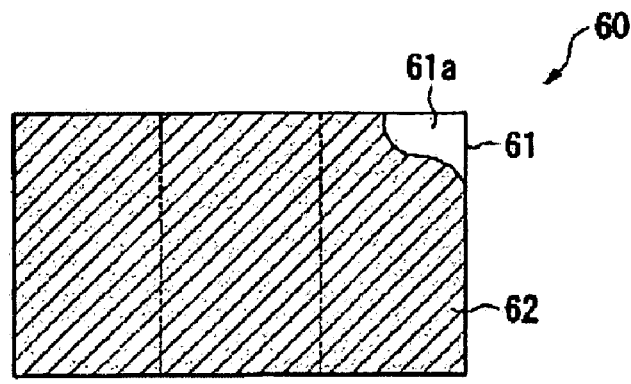
Figure 7B:
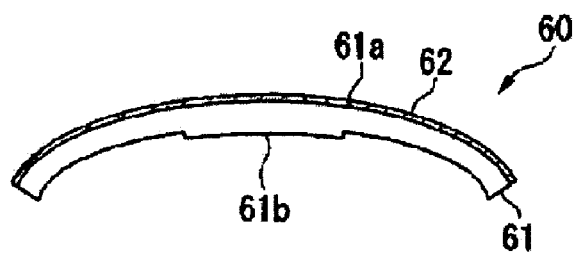
Figure 8A:
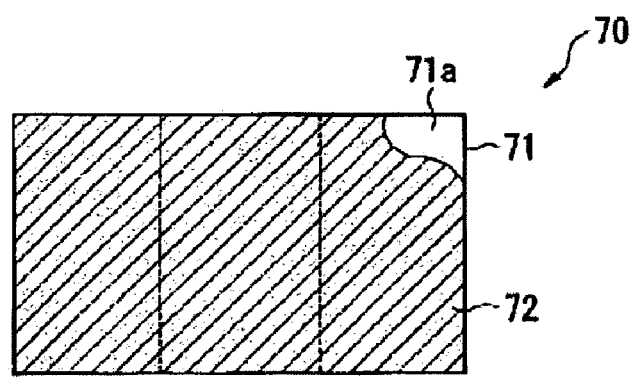
Figure 8B:
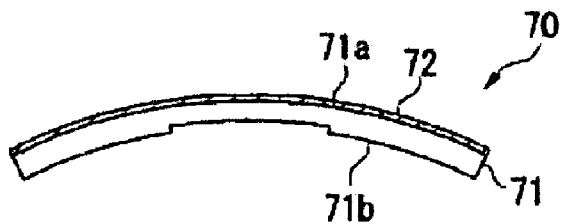

FIGS. 7 and 8 schematically show further examples of the semiconductor chip of the present invention, and in each of these figures, A is a plan view (top view) of the chip and B is a cross-sectional view.

In the example in FIG. 7, an insulating film 62 which serves as a warpage control film is formed over the entire top surface 61*a* of a substrate 61 of a semiconductor chip 60. Further, thickness differences are locally provided in the substrate 61. Specifically, at a bottom surface 61*b* of the substrate 61, a level difference is provided such that the central portion of the long edges of the rectangular substrate 61 is thicker and the two ends are thinner. This level difference can, for example, be formed via a method employing masking, such as dry etching or wet etching. Since the semiconductor chip 60 of the present example is provided with local thickness differences in the substrate 61, the curvature of the warpage of the substrate 61 will vary in its different parts. Specifically, the curvature of the warpage will be greater (the radius of curvature of the warpage will be smaller) toward the two ends of the substrate 61, where its thickness is smaller.

In the example in FIG. 8, likewise, an insulating film 72 which serves as warpage control film is formed over the entire top surface 71*a* of a substrate 71 of a semiconductor chip 70, and local thickness differences are provided in the substrate 71. In this example, at a bottom surface 71*b* of the substrate 71, a level difference is provided such that the central portion of the long edges of the rectangular substrate 61 is thinner and the two ends are thicker. Hence, in the semiconductor chip 70 of the present example, the curvature of the warpage will be greater (the radius of curvature of the warpage will be smaller) at the central portion of the substrate 71, where its thickness is smaller.

The application of such thickness differences is not limited to the semiconductor chip. Thickness differences may be equally provided in the circuit board of FIG. 2. Doing so will facilitate control of the circuit board warpage to a desired configuration such as warpage with varying curvature or warpage induced in certain parts only.

Further, multilayer interconnection of the circuit boards may be effected by utilizing glass epoxy boards or the like. It will be possible to control the warpage of the glass epoxy boards by adjusting the ratio of the thicknesses of the copper foils on their inner and outer sides, and/or by pressing after the boards are formed.

Figure 9:
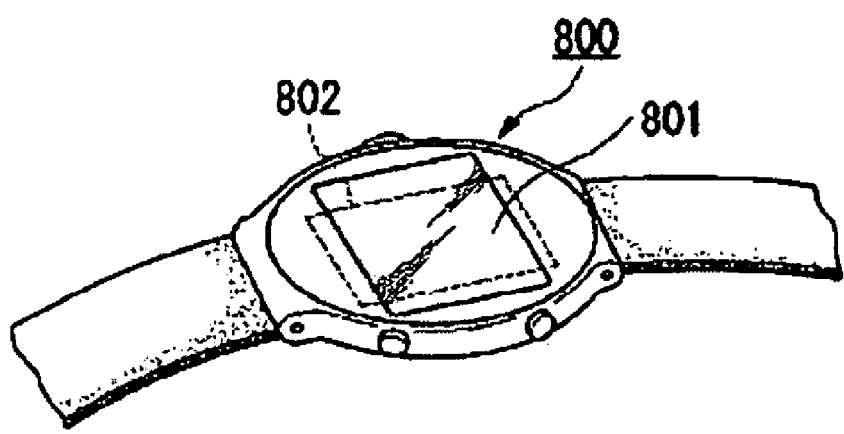
FIG. 9 is a perspective view showing an embodiment of the electronic equipment of the present invention.

FIG. 9 shows an embodiment of electronic equipment of the present invention.

The electronic equipment in this embodiment is equipped with the circuit board of FIG. 2. FIG. 9 is a perspective view of an example of a wristwatch, in which reference numeral 800 indicates the watch body, reference numeral 801 indicates a display device, and reference numeral 802 indicates the circuit board. The circuit board 802 is formed to be curved, so as to reduce the space that it occupies inside the case. Due to the curved surfaces of the circuit board 802, this wristwatch is rendered flatter and more compact, and allows greater degrees of freedom in design.

A preferred embodiment of the present invention has been described with reference to the appended drawings, however, the present invention is not limited to the examples that have been given. One skilled in the art could think of various variants or modifications within the scope of the claims. Such variants and modifications fall within the scope of the present invention.

What is claimed is:

1. A semiconductor chip, comprising:
   a substrate adapted to be mounted to a circuit board; and
   a warpage control film mounted to the substrate, the warpage control film controlling warpage of the substrate, the warpage control film including multiple film lines spaced apart along a direction parallel to an edge of the substrate and arranged to induce multiple curved surfaces in the substrate, the substrate having thickness differences locally provided to cause varied curvatures in its different parts.

2. The semiconductor chip according to claim 1, wherein the warpage control film further comprises a patterned warpage control film.

3. The semiconductor chip according to claim 1, wherein the substrate further comprises a thinning processed substrate.

4. The semiconductor chip according to claim 1, wherein the multiple film lines are provided on both a top surface and a bottom surface of the substrate to induce a wave shape in the substrate.

5. A semiconductor device, comprising:
a semiconductor chip including a substrate and a warpage control film mounted to the substrate;
a circuit board including curved surfaces, the semiconductor chip mounted on the curved surfaces of the circuit board; and
at least one coupling portion disposed between the semiconductor chip and the circuit board,
wherein the warpage control film controls the warpage of the substrate, the warpage control film including multiple film lines spaced apart along a direction parallel to an edge of the substrate and arranged to induce multiple curved surfaces in the substrate, the substrate having thickness differences locally provided to cause varied curvatures in its different parts.

6. The semiconductor device according to claim 5, wherein the multiple film lines are provided on both a top and a bottom surface of the substrate to induce a wave shape in the substrate.

7. The semiconductor device according to claim 5, wherein the circuit board further comprises a thinning processed circuit control board.

8. The semiconductor device according to claim 6, wherein the warpage control film includes at least two film lines extending diagonally relative to edges of the substrate.

9. The semiconductor device according to claim 5, wherein the circuit board further comprises a silicon circuit board.

10. Electronic equipment, comprising:
a semiconductor chip including a substrate and a warpage control film mounted to the substrate;
a circuit board including multiple curved surfaces, the semiconductor chip mounted on the curved surfaces of the circuit board; and
at least one coupling portion disposed between the semiconductor chip and the circuit board,
wherein the warpage control film controls warpage of the substrate the warpage control film including multiple film lines spaced apart along a direction parallel to an edge of the substrate and arranged to induce multiple curved surfaces in the substrate conforming to the multiple curved surfaces of the circuit board, the substrate having thickness differences locally provided to cause varied curvatures in its different parts.

11. A semiconductor device, comprising:
a circuit board adapted to be bonded to a semiconductor chip, the semiconductor chip including multiple curved surfaces; and
a warpage control film mounted on the circuit board, the warpage control film controlling warpage of the circuit board, the warpage control film including multiple film lines spaced apart along a direction parallel to an edge of the circuit board and arranged to induce multiple curved surfaces in the circuit board conforming to the multiple curved surfaces of the semiconductor chip, the circuit board having thickness differences locally provided to cause varied curvatures in its different parts.

12. The semiconductor chip according to claim 1, wherein the warpage control film further comprises a patterned warpage control film, the patterned warpage control film defining the multiple film lines.

13. The semiconductor device according to claim 11, wherein the circuit board further comprises a thinning processed circuit board.

14. The semiconductor device according to claim 13, wherein the multiple film lines are provided on both a top surface and a bottom surface of the circuit board to induce a wave shape in the circuit board.

15. The semiconductor device according to claim 11, wherein the circuit board further comprises a silicon circuit board.

16. Electronic equipment, comprising:
a semiconductor chip including multiple curved surfaces;
a circuit board on which the semiconductor chip is mounted;
a warpage control film mounted on the circuit board; and
at least one coupling portion,
wherein the warpage control film controls warpage of the circuit board, the warpage control film including multiple film lines spaced apart alone a direction parallel to an edge of the circuit board and arranged to induce multiple curved surfaces in the circuit board conforming to the multiple curved surfaces of the semiconductor chip,
wherein the circuit board has thickness differences locally provided to cause varied curvatures in its different parts.

17. A manufacturing method of a semiconductor device, comprising:
providing a semiconductor chip and a circuit board, one of the semiconductor chip and the circuit board including curved surfaces;
providing at least one bonding portion on the circuit board;
mounting the semiconductor chip on the circuit board;
wherein a warpage control film is mounted on the other one of the circuit board and the semiconductor chip substrate for controlling the warpage of the other one of the semiconductor chip substrate and the circuit board, the warpage control film including multiple film lines spaced apart along a direction parallel to an edge of the other one of the circuit board and the semiconductor chip substrate and arranged to induce multiple curved surfaces in the other one of the circuit board and the semiconductor chip substrate conforming to the curved surfaces of the one of the semiconductor chip and the circuit board, thickness differences locally provided in the other one of the semiconductor chip substrate and the circuit board.

18. The manufacturing method of a semiconductor device according to claim 17, further comprising patterning the warpage control film.

19. The manufacturing method of a semiconductor device according to claim 17, further comprising applying thinning processing to the other one of the semiconductor chip substrate and the circuit board.

20. The semiconductor device according to claim 5, wherein the warpage control film is disposed between the substrate of the semiconductor chip and the circuit board.

* * * * *